United States Patent [19]

Ahuja

[11] Patent Number: 5,307,381
[45] Date of Patent: Apr. 26, 1994

[54] SKEW-FREE CLOCK SIGNAL DISTRIBUTION NETWORK IN A MICROPROCESSOR

[75] Inventor: Bhupendra K. Ahuja, Fremont, Calif.

[73] Assignee: Intel Corporation, Santa Clara, Calif.

[21] Appl. No.: 816,385

[22] Filed: Dec. 27, 1991

[51] Int. Cl.[5] .......................... H04L 7/00; H03D 3/24
[52] U.S. Cl. .................................... 375/107; 375/120; 333/18; 307/269; 307/590
[58] Field of Search ............... 375/107, 106, 118, 120; 370/100.1; 328/153, 105; 307/269, 590, 602, 595; 333/18, 28 R

[56] References Cited

U.S. PATENT DOCUMENTS

| | | | |
|---|---|---|---|
| 3,725,793 | 3/1973 | Phillips | 375/107 X |
| 3,921,079 | 11/1975 | Heffner et al. | 375/107 X |
| 5,053,649 | 10/1991 | Johnson | 307/514 |
| 5,059,818 | 10/1991 | Whtt et al. | 307/269 |

Primary Examiner—Stephen Chin
Assistant Examiner—Tesfaldet Bocure
Attorney, Agent, or Firm—Blakely, Sokoloff, Taylor & Zafman

[57] ABSTRACT

A clock signal distribution network in a microprocessor for distributing a global clock signal to a plurality of units of the microprocessor includes a clock generator for generating a first clock signal with an input delay. A phase locked loop circuit generates a controllable delay to the first clock signal to become the global clock signal. A clock driver drives the global clock signal to the plurality of units. An electrical connector includes a plurality of connection lines for coupling the global clock signal to the plurality of units. A length equalizer equalizes the signal transfer delay of each of the plurality of connection lines such that the global clock signal reaches each of the plurality of units via each of the plurality of connection lines at the same time. Each of the plurality of units includes an area buffer for standardizing its input load to the clock driver. A dummy buffer introduces the input delay of the clock generator to the global clock signal. The phase locked loop circuit controls the generation of the controllable delay to the first clock signal in response to the output signal from the dummy buffer such that the global signal received at each of the plurality of units is synchronized to the clock input signal independent of a process variation, a temperature variation, and a voltage supply variation. The method of eliminating clock signal in the clock signal distribution network is also described.

15 Claims, 3 Drawing Sheets

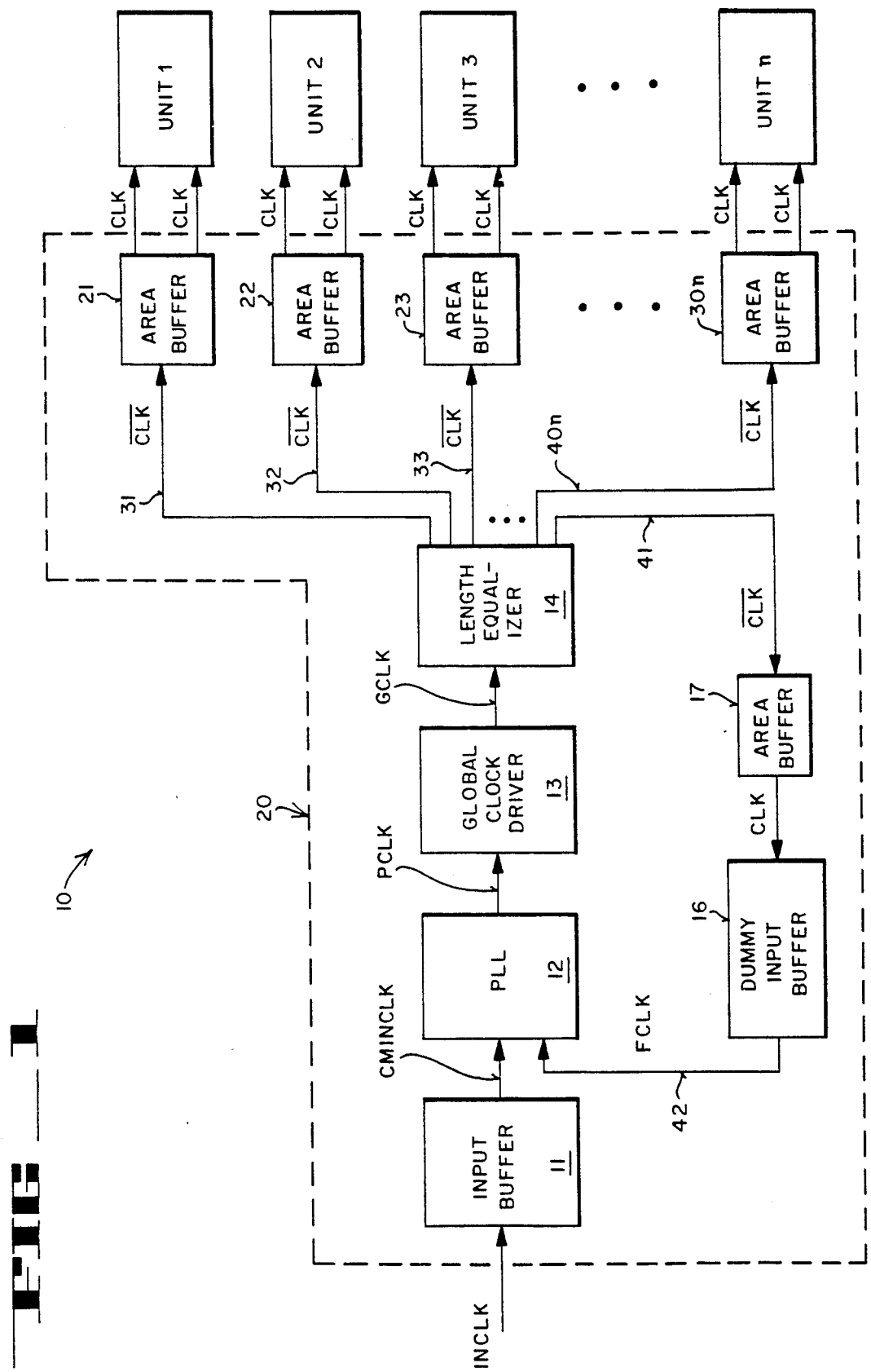
FIG_1

FIG_2
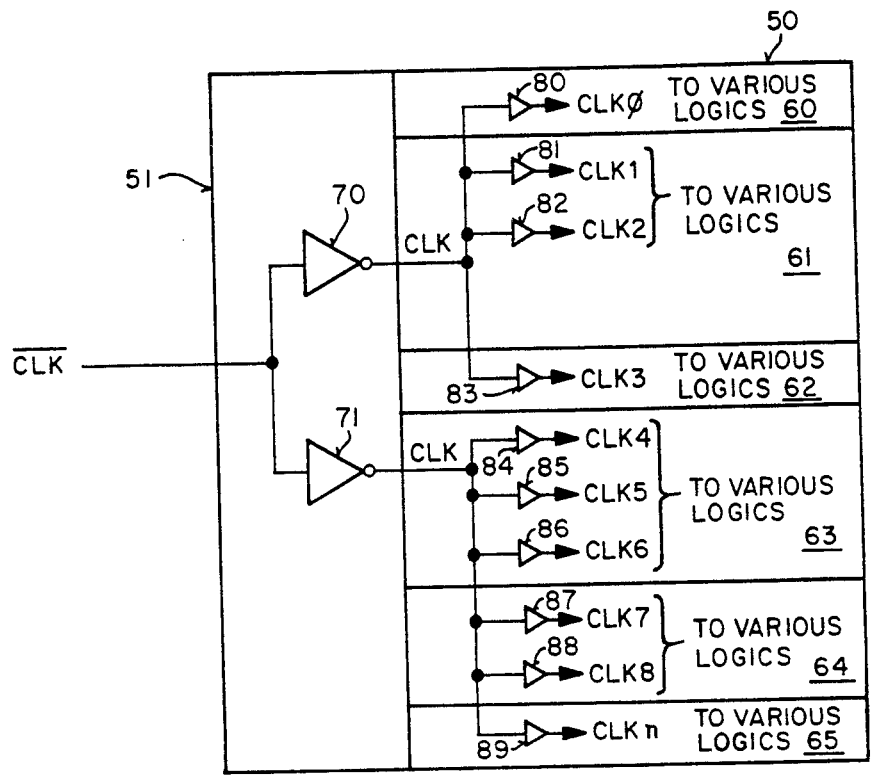
FIG_3
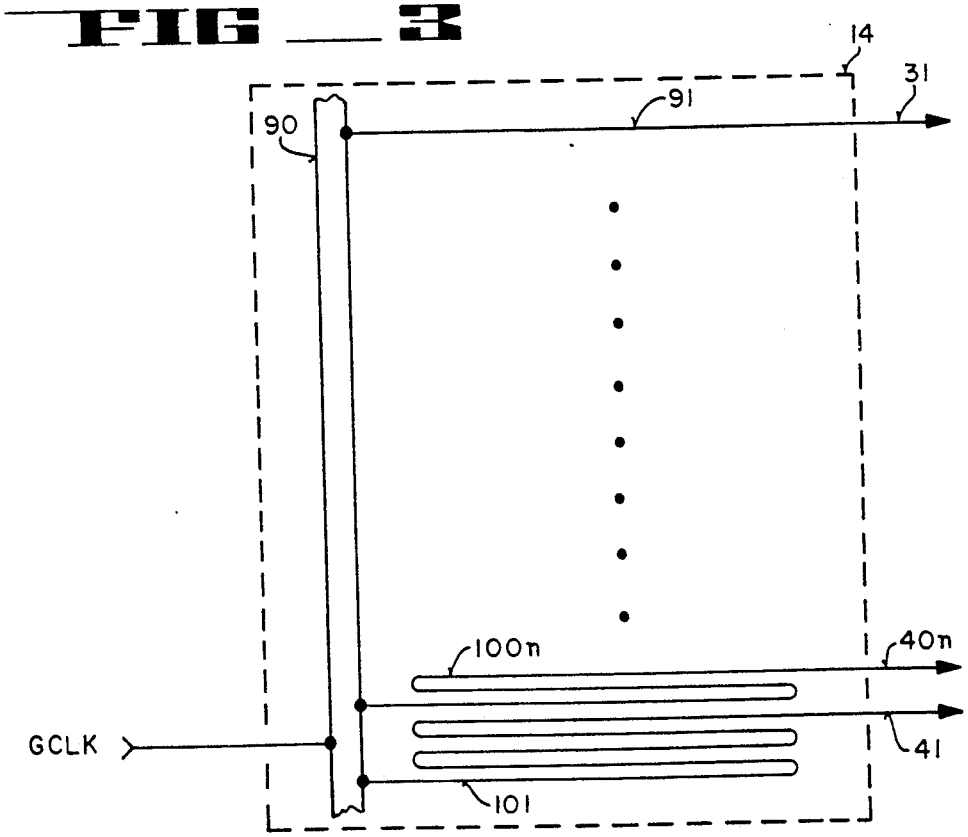

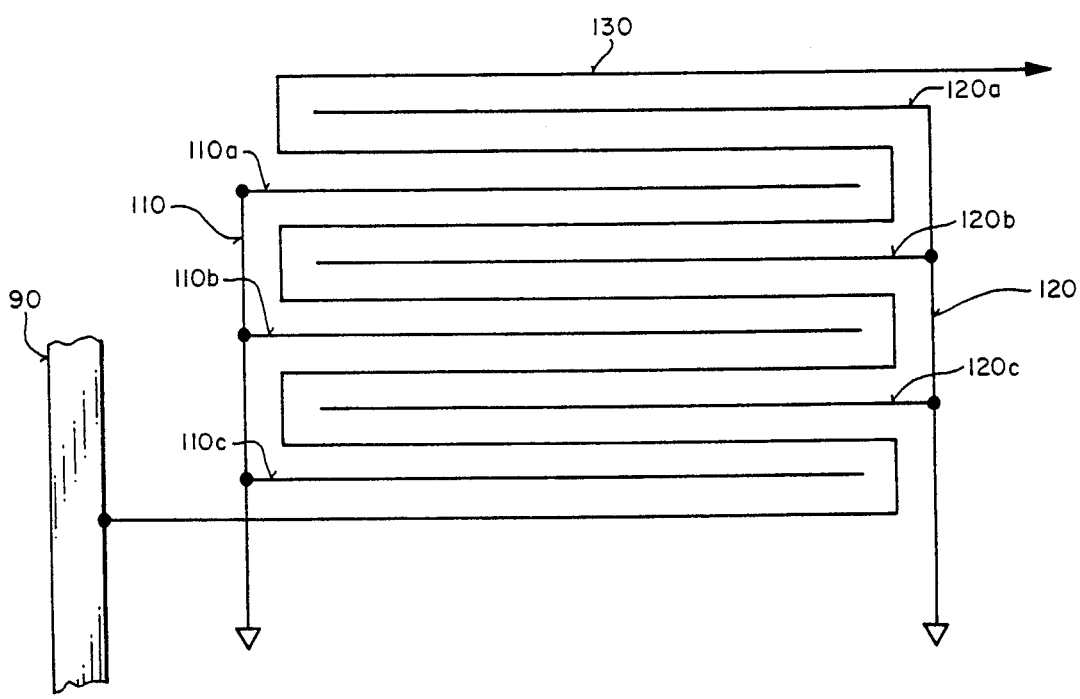

SKEW-FREE CLOCK SIGNAL DISTRIBUTION NETWORK IN A MICROPROCESSOR

FIELD OF THE INVENTION

The present invention pertains to the field of microprocessors. More particularly, this invention relates to a clock signal distribution network in a microprocessor, wherein the clock signal distribution network provides skew-free clock signals to various portions of the microprocessor.

BACKGROUND OF THE INVENTION

In a prior microprocessor integrated circuit chip, it is necessary to distribute a clock signal across the entire microprocessor chip for timing reference. Typically, a prior microprocessor includes a plurality of functional units integrated on the chip. These functional units typically include a register unit, an execution unit, an instruction cache, a data cache and/or a memory management unit.

Typically, the clock signal is generated from a signal clock input. This is typically accomplished by coupling a clock input signal of the microprocessor chip to a global driver circuit. The global driver circuit then couples the clock signal to various units of the microprocessor via a plurality of clock distribution lines.

One disadvantage associated with this prior clock signal distribution network in the microprocessor chip is that the clock signal distribution network introduces different delays to the clock signal (i.e., clock skew). The clock skew occurs when the clock signal distribution network has different clock delays. The factors that cause the clock skew are the electromagnetic propagation delays, buffer delays in the distribution network, and the RC delays in the clock distribution lines of the distribution network. The clock skew also varies from chip to chip due to process variations, temperature variations, power supply variations, and different loading capacitances.

Another disadvantage associated with such prior clock signal distribution network is that the inherent RC delay varies significantly from one clock distribution line to another when the die size of the microprocessor chip increases. As is known, the advances in semiconductor processing technology have made it possible to integrated more functional units into the prior microprocessor integrated circuit chip. The technology advances have also increased the clock frequencies of the prior microprocessor to provide higher speed, higher performance microprocessor. The increase in the die size of the microprocessor chip has caused some of the clock distribution lines to be very long to reach their respective units while some of the clock distribution lines are very short to reach their respective units. This results in the RC delays in the clock lines to be in a wider range that is more difficult to deal with. The higher frequency of the clock signal introduced to the microprocessor also makes the RC delays more significant.

A further disadvantage associated with the clock signal distribution network employed in the microprocessor is the load capacitance in each of the units of the microprocessor. The load capacitance also contributes to the clock skew in the clock signal distribution network. The load capacitance varies from unit to unit because different functional units integrated on the chip introduce different load capacitances.

SUMMARY AND OBJECTS OF THE INVENTION

One of the objects of the present invention is to provide means and a method of eliminating the clock skew in a clock signal distribution network of a microprocessor integrated circuit device.

Another object of the present invention is to provide means and a method of equalizing RC delays in the clock distribution lines of the clock distribution network.

Another object of the present invention is to provide means and a method for eliminating the clock skew in the clock signal distribution network by standardizing the load of each of the circuits of the microprocessor to the clock signal distribution network.

A further object of the present invention is to provide means and a method of eliminating the clock skew in the clock signal distribution network caused due to process variations, temperature variations, and power supply variations.

A clock signal distribution network is provided in a microprocessor for distributing a global clock signal to a plurality of units of the microprocessor. The distribution network, in one embodiment, includes a clock generator coupled to receive a clock input signal for generating a first clock signal. The clock generator generates an input delay to the first clock signal. A phase locked loop circuit is coupled to the clock generator for generating a controllable delay to the first clock signal to become the global clock signal. A clock driver is coupled to receive the global clock signal from the phase locked loop circuit for driving the global clock signal to the plurality of units of the microprocessor. An electrical connector having a plurality of connection lines coupled to receive the global clock signal from the clock driver for coupling the global clock signal to the plurality of units. Each of the plurality of connection lines generates a signal transfer delay to the global clock signal. The plurality of connection lines include a dummy connection line. A length equalizer is coupled between the clock driver and the electrical connector for equalizing the signal transfer delay of each of the plurality of connection lines such that the global clock signal reaches each of the plurality of units via each of the plurality of connection lines at the same time. Each of the plurality of units includes an area buffer coupled to one of the plurality of connection lines for standardizing an input load of each of the plurality of units to the clock driver. The area buffer receives the global signal from one of the plurality of connection lines and couples the global clock signal to its respective unit. A dummy buffer is coupled to the dummy connection line for generating the input delay to the global clock signal. The dummy buffer assumes the input delay of the clock generator. The dummy buffer applies its output signal to the phase locked loop circuit. The phase locked loop circuit controls the generation of the controllable delay to the first clock signal in response to the output signal from the dummy buffer such that the global signal received at each of the plurality of units is synchronized to the clock input signal independent of process variations, temperature variations, and voltage supply variations.

A method of eliminating clock skew in a clock signal distribution network of a microprocessor including a plurality of units is also described. The method, in one embodiment, comprises the steps of:

(A) generating a first clock signal by clock generation means from a clock input signal, wherein the clock generation means generates an input delay to the first clock signal due to process variations, temperature variations, and voltage supply variations;

(B) generating a controllable delay to the first clock signal by phase locked loop means to become the global clock signal;

(C) driving the global clock signal to the plurality of units of the microprocessor by clock driving means coupled to receive the global clock signal from the phase locked loop means;

(D) coupling the global clock signal to the plurality of units with electrical connection means having a plurality of connection lines coupled to receive the global clock signal from the clock driving means, wherein each of the plurality of connection lines generates a signal transfer delay to the global clock signal, wherein the plurality of connection lines include a dummy connection line;

(E) equalizing the signal transfer delay of each of the plurality of connection lines by length equalizing means coupled between the clock driving means and the electrical connection means such that the global clock signal reaches each of the plurality of units via each of the plurality of connection lines at the same time;

(F) standardizing an input load of each of the plurality of units to the clock driving means by area buffer means in each of the plurality of units, wherein the area buffer means receives the global signal from one of the plurality of connection lines and couples the global clock signal to its respective unit; and (G) generating the input delay to the global clock signal by dummy buffer means coupled to the dummy connection line, wherein the dummy buffer means assumes the input delay of the clock generation means, wherein the dummy buffer means applies its output signal to the phase locked loop means, wherein the phase locked loop means controls the generation of the controllable delay to the first clock signal in response to the output signal from the dummy buffer means such that the global signal received at each of the plurality of units is synchronized to the clock input signal independent of a process variation, a temperature variation, and a voltage supply variation.

Other objects, features, and advantages of the present invention will be apparent from the accompanying drawings and from the detailed description that follows below.

BRIEF DESCRIPTION OF THE DRAWINGS

The present invention is illustrated by way of example and not limitation in the figures of the accompanying drawings, in which like references indicate similar elements and in which:

FIG. 1 is a block diagram of a clock signal distribution network for a microprocessor chip, including a phase locked loop, a length equalizer, a plurality of area buffers and a dummy input buffer;

FIG. 2 illustrates one of the area buffers coupled to a unit of the microprocessor;

FIG. 3 illustrates one embodiment of the length equalizer of FIG. 1, including a plurality of serpentine lines;

FIG. 4 is an enlarged view showing one of the serpentine lines of FIG. 3.

DETAILED DESCRIPTION

FIG. 1 schematically illustrates in block diagram form an integrated circuit microprocessor chip 10 (i.e., microprocessor), which implements a preferred embodiment of the present invention.

In one preferred embodiment, microprocessor 10 comprises 80586 microprocessor (i.e., i586 TM CPU) manufactured by Intel Corporation of Santa Clara, Calif. In another preferred embodiment, microprocessor 10 comprises 80486 microprocessor (i.e., i486 TM CPU) also manufactured by Intel Corporation. In alternative embodiments, microprocessor 10 may comprise other types of microprocessors. For example, microprocessor 10 may comprise 80386 microprocessor or 80286 microprocessor. In the currently preferred embodiment, microprocessor 10 employs BICMOS circuitry.

In FIG. 1, microprocessor 10 includes a plurality of functional units UNIT1 through UNITn and a clock signal distribution network 20. In the presently preferred embodiment, functional units UNIT1 through UNITn and clock signal distribution network 20 reside on a single semiconductor chip.

Functional units UNIT1 through UNITn together perform functions of a microprocessor for processing and manipulating data and machine based instructions. These functional units UNIT1 through UNITn are located in different areas of the substrate of microprocessor 10. For example, UNIT1 may be located at an edge area of microprocessor 10 and UNITn may be located at a center area of microprocessor 10. Functional units UNIT1 through UNITn may be coupled to one another.

Typically, functional units UNIT1 through UNITn of microprocessor 10 include a bus interface unit for interfacing microprocessor 10 with external buses (not shown), a cache unit for storing data and instructions for processing, an arithmetic logic unit for performing mathematical calculations, an integer execution unit for instruction execution, and a floating point unit for controlling data processing. Functional units UNIT1 through UNITn may also include a memory management unit for managing data storage in the cache unit. It shall be, however, noted that functional units UNIT1 through UNITn are not limited to the above-mentioned units. Other units may be included. For example, functional units UNIT1 through UNITn may include an instruction decode unit and a segmentation unit for dividing instructions into segments for pipelined operation.

Functional units UNIT1 through UNITn of microprocessor 10 each may also include one or more functional blocks. For example, the floating point unit of functional units UNIT1 through UNITn may comprise a floating point control block and a floating point register file block for floating point computation.

Each of functional units UNIT1-UNITn of microprocessor 10 is supplied with a clock signal CLK for its logic operation. The clock signal CLK serves as the timing reference for functional units UNIT1-UNITn. Each logic operation within each of the functional units UNIT1-UNITn typically occurs in synchronization with the clock signal CLK or in response to a signal controlled by the clock signal CLK. Each of functional units UNIT1-UNITn receives the clock signal CLK through clock signal distribution network 20 of microprocessor 10.

In one preferred embodiment, the frequency of the clock signal is 66 MHz (i.e., megahertz). In an alternative embodiment, the frequency of the clock signal CLK may be lower or higher than 66 MHz. For instance, the frequency of the clock signal CLK may be 90 MHz. In a further example, the frequency of the clock signal CLK may be 25 MHz.

As described above, clock signal distribution network 20 couples the clock signal CLK to each of functional units UNIT1-UNITn. Clock signal distribution network 20 receives a clock input signal INCLK from external clock circuitry (not shown). The external clock circuitry may be a crystal oscillator or any other source which can generate a clock pulse with the desired degree of accuracy.

Clock signal distribution network 20 generates the clock signal CLK from the clock input signal INCLK and then applies the clock signal CLK to each of functional units UNIT1-UNITn. The generation of the clock signal CLK in clock signal distribution network 20 and its coupling of the clock signal CLK to functional units UNIT1-UNITn will be described in detail below.

In the presently preferred embodiment, the clock signal CLK is synchronous to the clock input signal INCLK.

Clock signal distribution network 20 of microprocessor 10 includes an input buffer 11 coupled to receive the clock input signal INCLK. Input buffer 11 buffers the clock input signal INCLK and converts the signal level of the INCLK signal from TTL level to CMOS level. Input buffer 11 then outputs a buffered clock input signal CMINCLK.

Input buffer 11 may be or comprise other type of circuits. For example, input buffer 11 may be a clock generation circuit. As a further example, input buffer 11 may include a frequency divider circuit.

Due to the logic operation, input buffer 11 introduces signal delay to the CMINCLK signal. The signal delay varies from device to device due to process, power supply, and temperature variations. The signal delay introduced to the CMINCLK signal in input buffer 11 is hereinafter referred to as $D_1$ delay.

Clock signal distribution network 20 also includes a phase locked loop ("PLL") 12 coupled to input buffer 11. PLL 12 receives the CMINCLK signal from input buffer 11 and provides a controllable delay $D_0$ to the CMINCLK signal received. PLL 12 then outputs a signal PCLK that is essentially the clock input signal INCLK with delays of $D_0$ and $D_1$. The circuitry of PLL 12 is well known in the art and will not be described in detail hereinafter. It shall also be noted that PLL 12 may utilize any suitable PLL circuit known in the art in the presently preferred embodiment of the present invention. The function of PLL 12 to provide the controllable delay $D_0$ will be described in more detail below.

Clock signal distribution network 20 further includes a global clock driver 13. Global clock driver 13 receives the PCLK signal from PLL 12. Global clock driver 13 is employed in clock signal distribution network 20 to drive the PCLK signal to all of functional units UNIT1-UNITn. A variety of clock driver circuits are well known in the art, and global clock driver 13 may utilize any suitable driver circuit known in the art in the presently preferred embodiment of the present invention.

In the presently preferred embodiment, global clock driver 13 is physically located at or near the center of microprocessor 10. In alternative embodiments, global clock driver 13 may be located in other areas of microprocessor 10. For example, global clock driver 13 may be located on an edge of microprocessor 10.

Global clock driver 13 then outputs a global clock signal GCLK. Due to the logic operation, global clock driver 13 also introduces a signal delay $D_2$ to the GCLK signal. The $D_2$ delay also varies from device to device due to process, temperature, and power supply variations.

Basically, the GCLK signal is the clock input signal INCLK with $D_0$, $D_1$, and $D_2$ delays. However, the GCLK signal is driven by global clock driver to be powerful enough to supply to each of functional units UNIT1-UNITn.

Clock signal distribution network 20 includes a length equalizer 14, a plurality of clock lines 31 through 40n, and a plurality of area buffers 21 through 30n. Length equalizer 14 receives the GCLK signal and applies the GCLK signal to each of area buffers 21 through 30n via each of clock lines 31 through 40n. As can be seen from FIG. 1, clock lines 31 through 40n are coupled to length equalizer 14. As also can be seen from FIG. 1, each of clock lines 31-40n is coupled to its respective one of area buffers 21-30n.

Each of area buffers 21-30n is coupled to its respective one of functional units UNIT1-UNITn. Each of area buffers 21-30n receives a CLK signal via its respective one of clock lines 31-40n and couples the clock signal CLK to its respective one of functional units UNIT1-UNITn. Each of area buffers 21-30n introduces a $D_4$ delay to the input clock signal $\overline{CLK}$. The $D_4$ delay in each of area buffers 21-30 is equal. Thus, the CLK signal is the inverted signal of the $\overline{CLK}$ signal received at the input side of each of area buffers 21-30n with the $D_4$ delay.

The function of each of area buffers 21-30n is to isolate the load of its 10 respective one of functional units UNIT1-UNITn towards global clock driver 13 and present a uniform and standard load towards global clock driver 13. The load of each of functional units UNIT1-UNITn varies from one functional unit to another. The $D_4$ delay introduced is also uniform for each of area buffers 21-30.

In the presently preferred embodiment, each of area buffers 21-30n is located within the area of its respective one of functional units UNIT1-UNITn. The circuit of one of area buffers 21-30n is shown in FIG. 2, which will be described in more detail below. Length equalizer 14 is, in the presently preferred embodiment, located within the area of global clock driver 13, which is the center area of microprocessor 10. As is seen from FIG. 1, length equalizer 14 is coupled to clock lines 31-40n.

Each of clock lines 31-40n couples the $\overline{CLK}$ signal to its respective one of area buffers 21-30n. The $\overline{CLK}$ signal received at each of area buffers 21-30n via each of clock lines 31-40n is derived from the GCLK. In essence, the $\overline{CLK}$ signal via each of clock lines 31-40n is the GCLK signal with a delay introduced from length equalizer 14 and the respective one of clock lines 31-40n. This delay is referred to hereinafter as $D_3$ delay. As is known, each of clock lines 31-40n generates an RC delay to the signal passing through the line. The RC delay on each of clock lines 31-40n is in proportion to the length of the line and the load of the respective one of area buffers 21-30n. Given that the load of area buffers 21-30n is uniform and standard, the RC delay on each of clock lines 31-40n therefore varies from one to another, depending only on the length of each of clock lines 31-40n.

As described above, the $\overline{CLK}$ signal is the GCLK signal with the $D_3$ delay. Therefore, the $\overline{CLK}$ signal is the INCLK signal with CMOS voltage level and with the $D_0$, $D_1$, $D_2$, $D_3$ delays and the CLK signal is the INCLK signal with CMOS voltage level and with the $D_0$, $D_1$, $D_2$, $D_3$, and $D_4$ delays.

As described above, each of functional units UNIT1-UNITn is located in different areas of microprocessor 10. This causes the lengths of clock lines 31-40n to vary in a wide range when the chip size of microprocessor 10 is large. The variation in length of clock lines 31-40n results in the RC delays in clock lines 31-40n to vary accordingly, thus causing the $\overline{CLK}$ signal to reach each of area buffers 21-30n at different timings due to the different RC delays of clock lines 31-40n.

To allow the $\overline{CLK}$ signal arrive at each of area buffers 21-30n at the same time via clock lines 31-40n, length equalizer 14 equalizes the length of all of clock lines 31-40n such that the $D_3$ delay for the $\overline{CLK}$ signal on each of clock lines 31-40n is equal. To accomplish this, length equalizer 14 includes a plurality of serpentine lines (not shown), each coupled to one of clock lines 31-40n. FIGS. 3-4 schematically illustrate the serpentine lines of length equalizer 14, which will be described in detail below.

The length of each serpentine line in length equalizer 14 varies depending on the clock line to which it couples. For example, if clock line 31 is the longest line among clock lines 31-40n and is, for example, 12,000 μm long and clock line 40n is the shortest one and is, for example, 4,000 μm long, the serpentine line that couples to clock line 40n adds an additional length of 8,000 μm to clock line 40n. In this case, every other clock lines of clock lines 31-40n receive their additional length from their respective serpentine lines in length equalizer 14 to match up with the longest clock line 31, thus achieving uniform $D_3$ delay on all of clock lines 31-40n to the $\overline{CLK}$ signal.

It shall be noted that the length of the longest clock line is not limited to 12,000 μm and the shortest clock line is not limited to 4,000 μm. The actual length for one of clock lines 31-40n is determined by the distance between global clock driver 13 and the respective one of functional units UNIT1-UNITn the clock line is coupled to.

Length equalizer 14 is within the area of global clock driver 13 in the presently preferred embodiment in order to minimize the distance between global clock driver 13 and length equalizer 14. Also since the serpentine shape of each of the serpentine lines of length equalizer 14 occupies minimum space in length equalizer 14, it causes all of such lines to be physically located at one position on the chip, thereby minimizing any process and temperature variations caused to each of serpentine lines. The serpentine lines of length equalizer 14 will be described in more detail below, in conjunction with FIGS. 3 and 4.

Clock lines 31-40n are metal layers deposited on an insulating layer of the semiconductor substrate of microprocessor 10. The width of each of clock lines 31-40n is greater than 2.7 μm. In one preferred embodiment, the width of each of clock lines 31-40n is 3 μm. In another preferred embodiment, the width of each of clock lines 31-40n is 4 μm. In the presently preferred embodiment, clock lines 31-40n are fabricated from the same layer.

As described above, the CLK clock signal coupled to each of functional units UNIT1-UNITn is synchronous with the clock input signal INCLK. It is therefore necessary for clock signal distribution network 20 to adjust the delays introduced to the CLK signal from each area buffers 21-30n via each of clock lines 31-40. As described above, the $\overline{CLK}$ signal is made to arrive at each of area buffers 21-30n at the same time via each of clock lines 31-40n. The CLK signal via each of clock lines 31-40n therefore assumes the same amount of delays in distribution network 20 of the INCLK signal. Given that each of area buffers 21-30n generates the same $D_4$ delay to the $\overline{CLK}$ signal, the total delay D (i.e., clock skew) of the CLK signal to the INCLK signal equals:

$$D = D_0 + D_1 + D_2 + D_3 + D_4 \quad (1)$$

in which $D_0$ is the controllable delay of PLL 12, $D_1$ is the buffer delay of input buffer 11, $D_2$ is the delay of global clock driver 13, and $D_3$ delay is the RC delay of any one of clock lines 31-40n with its coupled serpentine line in length equalizer 14. As described above, the load of each of functional units UNIT1-UNITn has been isolated by its respective one of area buffers 21-30n. Therefore, the RC delays of the clock lines 31-40n are not affected by the variable load capacitances of functional units UNIT1-UNITn.

$D_0$ delay of PLL 12 is the only adjustable delay in distribution network 20. To allow the CLK signal to be synchronous with the INCLK signal, the total delay from input buffer 11 to each of area buffers 21-30n should be equal to either zero or the entire phase T of the INCLK signal. In the presently preferred embodiment, the $D_0$ delay is controlled by PLL 12 such that the total delay D from input buffer 11 to each of area buffers 21-30n equals the phase T of INCLK signal.

In order to control the $D_0$ delay in PLL 12, a feedback loop is provided in distribution network 20. The feedback loop includes a dummy clock line 41 from length equalizer 14. Dummy clock line 41 couples the $\overline{CLK}$ signal to a dummy area buffer 17. Dummy clock line 41 and its coupled serpentine line in length equalizer 14 assumes the same $D_3$ delay as any other one of clock lines 31-40n. Dummy area buffer 17 has the same $D_4$ delay as each of area buffers 21-30n. Dummy area buffer 17 also assumes the same load as any other one of area buffers 21-30n.

The feedback loop also includes a dummy input buffer 16 coupled to dummy area buffer 17. Dummy input buffer 16 receives the CLK signal from dummy area buffer 17 and couples a FCLK signal to PLL 12 via line 42. Dummy input buffer 16 is manufactured in the same manner and at the same area on the microprocessor chip as input buffer 11. In this way, dummy input buffer 16 assumes the same signal delay $D_1$ of input buffer 11 and the FCLK signal introduces the $D_1$ delay to PLL 12 via line 42. The function of dummy input buffer 16 is to introduce the $D_1$ delay to PLL 12. The FCLK signal also introduces the $D_2$ delay, the $D_3$ delay, and the $D_4$ delay to PLL 12. Controlled by the FCLK signal, PLL 12 generates the controllable $D_0$ delay to PCLK signal (eventually to CLK signal) such that the total delay D of the CLK signal is equal to the phase T of the INCLK signal. Therefore, the CLK signal is maintained in synchronous with the INCLK signal.

FIG. 2 illustrates an area buffer 51 coupled to a functional unit 50. Area buffer 51 in FIG. 2 is one of area buffers 21 through 30n shown in FIG. 1. Functional unit 50 is one of functional units UNIT1-UNITn shown in FIG. 1.

As shown in FIG. 2, functional unit 50 includes functional blocks 60 through 65. In FIG. 2, only six blocks 60-65 are shown. In practice, more or fewer than six functional blocks may be included in a functional unit. Each functional block receives the CLK signal via one or more local buffers. For example, functional block 61 includes local buffers 81 and 82, each being coupled to receive the CLK signal. Local buffer 81 then generates a CLK1 clock signal which is the equivalent signal of the CLK signal. In the same manner, local buffer 82 generates a CLK2 clock signal. The CLK1 and CLK2 clock signals are then applied to various logic circuits in functional block 61, respectively.

Area buffer 51 includes two large inverters 70 and 71 with the same load. Each of inverters 70 and 71 receives the $\overline{CLK}$ signal and generates the CLK signal, respectively. Inverter 70 is coupled to functional blocks 60-62 and inverter 71 couples the CLK signal to functional blocks 63-65.

In the presently preferred embodiment, each of inverters 70 and 71 is a BICMOS inverter capable of driving a load with approximately 7 pF capacitance. Each of inverters 70 and 71 has approximately 0.5 pF input load capacitance. As described above, area buffer 51 is located within functional unit 50.

In the presently preferred embodiment, the maximum load capacitance for each of inverters 70-71 is 7 pF. Therefore, the number of local buffers coupled to one inverter is determined by the 7 pF total local buffer input load capacitance. If more local buffers are needed to supply the clock signal in functional unit 50, additional inverter or inverters may be needed to drive these additional local buffers. In the presently preferred embodiment, each local buffer has an input load capacitance of less than 0.2 pF.

In the situation in which area buffer 51 needs to drive only one local buffer, one of inverters 70 and 71 can be kept floating.

FIG. 3 schematically illustrates the serpentine lines of length equalizer 14. In FIG. 3, length equalizer 14 includes a large metal bus 90. The GCLK signal from global clock driver 13 (FIG. 1) is coupled to metal bus 90. Metal bus 90 then couples the GCLK signal to a plurality of serpentine lines 91 through 100n. As described above, each of serpentine lines 91-100n is coupled to its respective one of clock lines 31-40n.

As described above, length equalizer 14 is located within the area of global clock driver 13 (FIG. 1) in the presently preferred embodiment. In this case, metal bus 90 and serpentine lines 91-100n are located close to the output end of global clock buffer 13.

The length of each of serpentine lines 91-100n varies, depending on the length of its respective one of clock lines 31-40n. The function of the serpentine lines 91-100n is to make the GCLK signal reach each of area buffers 21-30n (FIG. 1) from metal bus 90 at the same time via each of serpentine lines 91-100n and each of clock lines 31-40n.

Length equalizer 14 also includes a serpentine line 101 coupled to dummy clock line 41. The length of serpentine line 101 and dummy clock line 41 equals to the length of any one of the serpentine lines 91-100n plus its respective one of clock lines 31-40n.

The serpentine shape (e.g., S shape) of the serpentine lines 91-100n and 101 allows length equalizer 14 to occupy minimum space on the microprocessor chip. The width of each of the serpentine lines 91-101 is greater then 2.7 μm. In one preferred embodiment, the width of each of the serpentine lines 91-101 is 3 μm. In a further preferred embodiment, the width of each of the serpentine lines 91-101 is 4 μm in order to provide heat margin.

As can been seen from FIG. 3, each serpentine line may comprise at least one U-shaped curve. In the presently preferred embodiment, the opening of the U shape is 3.5 μm wide. In alternative embodiments, the opening may be wider or narrower than 3.5 μm. For example, the opening may be 2 μm wide.

If the longest one of clock lines 31-40n does not required additional length, its respective serpentine line is a straight line.

In an alternative embodiment, length equalizer 14 includes one serpentine line with a plurality of taps at various positions of the serpentine line. Each tap is then coupled to one of clock lines 31-40n. The GCLK signal is thus coupled to each of clock lines 31-40n at each of the taps. The position of each tap on the serpentine line is determined by the length of each of clock lines 31-40n such that the GCLK signal reaches each of area buffers 21-30n at the same time via clock lines 31-40n.

FIG. 4 illustrates one specific embodiment of implementing the serpentine line in length equalizer 14 of FIGS. 1 and 3. In FIG. 4, one serpentine line 130 is coupled to metal bus 90. Serpentine line 130 can be any one of the serpentine lines 91-101 in FIG. 3. Serpentine line 130 includes six U-shaped curves overlapping with each other, as shown in FIG. 4. In practice, more or fewer than 6 U-shaped curves may be formed. The number of the U-shaped curves for each serpentine line is in proportion to the length of the serpentine line.

Within the opening of each U-shaped curve of the serpentine line 130, there is a ground line. Therefore, the serpentine line 130 includes six ground lines 110a-110c and 120a-120c, each being located in the opening of one of the U-shaped curves of the serpentine line 130.

The function of implementing the ground lines 110a-110c and 120a-120c in the U-shaped curves of the serpentine line 130 is to eliminate any cross coupling resulted from the narrow opening for each of the U-shaped curves. Another factor that contributes to the cross coupling is the skinning effect to the signal travelling on the serpentine line 130. The skinning effect causes the signal to travel along the skin of the serpentine line 130. By placing ground lines 110a-110c and 120a-120c in the opening of each of the U-shaped curves, the clock signal is ensured to travel through the entire serpentine line 130 without any short cut.

In the foregoing specification, the invention has been described with reference to specific embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. A clock signal distribution network residing in a microprocessor for distributing a global clock signal to a plurality of units of the microprocessor, comprising:

clock generation means coupled to receive a clock input signal for generating the global clock signal;

clock driving means coupled to receive the global clock signal from the clock generation means for driving the global clock signal to the plurality of units of the microprocessor;

electrical connection means having a plurality of connection lines coupled to receive the global clock signal from the clock driving means for coupling the global clock signal to the plurality of units, wherein each of the plurality of connection lines generates a signal transfer delay to the global clock signal;

length equalizing means coupled between the clock driving means and the electrical connection means for equalizing the signal transfer delay of each of the plurality of connection lines such that the global clock signal reaches each of the plurality of units via each of the plurality of connection lines at the same time; and area buffer means in each of the plurality of units coupled to one of the plurality of connection lines for standardizing an input load of each of the plurality of units to the clock driving means, wherein the area buffer means receives the global signal from one of the plurality of connection lines and couples the global clock signal to its respective unit.

2. The clock signal distribution network of claim 1, wherein the length equalizing means comprises a plurality of serpentine lines, each being coupled to one of the plurality of connection lines, wherein the plurality of serpentine lines are of different lengths such that the global clock signal can reach the area buffer means of each of the plurality of units via each of the plurality serpentine lines and each of the plurality of connection lines at the same time.

3. The clock signal distribution network of claim 2, wherein some of the plurality of serpentine lines has at least one S-shaped curve, wherein the S-shaped curve has two spacings, each being approximately 3.5 micron wide.

4. The clock signal distribution network of claim 3, wherein the length equalizing means further comprises a ground-coupled line located in each of the spacings of the S-shaped curve for avoiding short circuiting caused by skinning effect of the S-shaped curve.

5. The clock signal distribution network of claim 1, wherein the area buffer means comprises two inverters, wherein each of the inverters are large enough to isolate the load of its respective unit to the clock driving means.

6. The clock signal distribution network of claim 5, wherein each of the inverters is a BICMOS inverter.

7. A clock signal distribution network residing in a microprocessor for distributing a global clock signal to a plurality of units of the microprocessor, comprising:

clock generation means coupled to receive a clock input signal for generating a first clock signal, wherein the clock generation means generates an input delay to the first clock signal;

phase locked loop means coupled to the clock generation means for generating a controllable delay to the first clock signal to become the global clock signal;

clock driving means coupled to receive the global clock signal from the phase locked loop means for driving the global clock signal to the plurality of units of the microprocessor;

electrical connection means having a plurality of connection lines coupled to receive the global clock signal from the clock driving means for coupling the global clock signal to the plurality of units, wherein each of the plurality of connection lines generates a signal transfer delay to the global clock signal, wherein the plurality of connection lines include a dummy connection line;

length equalizing means coupled between the clock driving means and the electrical connection means for equalizing the signal transfer delay of each of the plurality of connection lines such that the global clock signal reaches each of the plurality of units via each of the plurality of connection lines at the same time;

area buffer means in each of the plurality of units coupled to one of the plurality of connection lines for standardizing an input load of each of the plurality of units to the clock driving means, wherein the area buffer means receives the global signal from one of the plurality of connection lines and couples the global clock signal to its respective unit; and dummy buffer means coupled to the dummy connection line for generating the input delay to the global clock signal, wherein the dummy buffer means has a dummy input delay approximately equal to the input delay of the clock generation means, wherein the dummy buffer means applies its output signal to the phase locked loop means, wherein the phase locked loop means controls the generation of the controllable delay to the first clock signal in response to the output signal from the dummy buffer means such that the global signal received at each of the plurality of units is synchronized to the clock input signal independent of a process variation, a temperature variation, and a voltage supply variation.

8. The clock signal distribution network of claim 7, wherein the length equalizing means comprises a plurality of serpentine lines, each being coupled to one of the plurality of connection lines, wherein the plurality of serpentine lines are of different lengths such that the global clock signal can reach the area buffer means of each of the plurality of units via each of the plurality serpentine lines and each of the plurality of connection lines at the same time.

9. The clock signal distribution network of claim 8, wherein each of the plurality of serpentine lines has at least one S-shaped curve, wherein the S-shaped curve has two spacings, each being approximately 3.5 micron wide.

10. The clock signal distribution network of claim 9, wherein the length equalizing means further comprises a ground-coupled line located in each of the spacings of the S-shaped curve for avoiding short circuiting caused by a skinning effect in the S-shaped curve.

11. The clock signal distribution network of claim 7, wherein the area buffer means comprises two inverters, wherein each of the inverters are large enough to isolate the load of its respective unit to the clock driving means.

12. The clock signal distribution network of claim 11, wherein each of the inverters is a BICMOS inverter.

13. A method of eliminating clock skew in a clock signal distribution network or a microprocessor including a plurality of units, comprising the steps of:

(A) generating a first clock signal by clock generation means from a clock input signal, wherein the clock generation means generates an input delay to the first clock signal wherein said input delay may vary due to a process variation, a temperature variation, and a voltage supply variation;

(B) generating a controllable delay to the first clock signal by phase locked loop means to become the global clock signal;

(C) driving the global clock signal to the plurality of units of the microprocessor by clock driving means coupled to receive the global clock signal from the phase locked loop means;

(D) coupling the global clock signal to the plurality of units with electrical connection means having a plurality of connection lines coupled to receive the global clock signal from the clock driving means, wherein each of the plurality of connection lines generates a signal transfer delay to the global clock signal, wherein the plurality of connection lines include a dummy connection line;

(E) equalizing the signal transfer delay of each of the plurality of connection lines by length equalizing means coupled between the clock driving means and the electrical connection means such that the global clock signal reaches each of the plurality of units via each of the plurality of connection lines at the same time;

(F) standardizing an input load of each of the plurality of units to the clock driving means by area buffer means in each of the plurality of units, wherein the area buffer means receives the global signal from one of the plurality of connection lines and couples the global clock signal to its respective unit; and (G) generating the input delay to the global clock signal by dummy buffer means coupled to the dummy connection line, wherein the dummy buffer means has a dummy input delay approximately equal to the input delay of the clock generation means, wherein the dummy buffer means applies its output signal to the phase locked loop means, wherein the phase locked loop means controls the generation of the controllable delay to the first clock signal in response to the output signal from the dummy buffer means such that the global signal received at each of the plurality of units is synchronized to the clock input signal independent of a process variation, a temperature variation, and a voltage supply variation.

14. The method of claim 13, wherein the step (E) further comprises a step of providing a plurality of serpentine lines in the length equalizing means, each being coupled to one of the plurality of connection lines, wherein the plurality of serpentine lines are of different lengths such that the global clock signal can reach the area buffer means of each of the plurality of units via each of the plurality serpentine lines and each of the plurality of connection lines at the same time.

15. The method of claim 14, further comprising a step of avoiding short circuiting caused by skinning effect of S-shaped curves of the plurality of serpentine lines by providing a plurality of ground-coupled lines within each of the plurality of serpentine lines.

* * * * *

UNITED STATES PATENT AND TRADEMARK OFFICE
CERTIFICATE OF CORRECTION

PATENT NO. : 5,307,381
DATED : April 26, 1994
INVENTOR(S) : Bhupendra K. Ahuja

It is certified that error appears in the above-indentified patent and that said Letters Patent is hereby corrected as shown below:

Column 13; Line 2; Delete "or"; Insert in place thereof --of--

Signed and Sealed this

Nineteenth Day of September, 1995

Attest:

BRUCE LEHMAN

Attesting Officer

Commissioner of Patents and Trademarks